United States Patent [19]

Wells

[11] Patent Number: 4,665,313
[45] Date of Patent: May 12, 1987

[54] APPARATUS AND METHOD FOR DISPLAYING HOLE-ELECTRON PAIR DISTRIBUTIONS INDUCED BY ELECTRON BOMBARDMENT

[75] Inventor: Oliver C. Wells, Yorktown Heights, N.Y.

[73] Assignee: International Business Machines Corporation, Armonk, N.Y.

[21] Appl. No.: 750,624

[22] Filed: Jun. 28, 1985

[51] Int. Cl.⁴ ............................................. H01J 37/26
[52] U.S. Cl. ................................. 250/306; 250/423 F; 250/307
[58] Field of Search ............... 250/306, 307, 310, 397, 250/423 F

[56] References Cited

U.S. PATENT DOCUMENTS

| | | | |
|---|---|---|---|
| 3,448,377 | 6/1969 | Seiwatz | 250/306 |
| 3,558,880 | 1/1971 | Kniseley | 250/310 |
| 3,558,885 | 1/1971 | Flemming | 250/310 |
| 4,343,993 | 8/1982 | Binnig et al. | 250/423 F |
| 4,575,630 | 3/1986 | Lukianoff | 250/307 |

OTHER PUBLICATIONS

"The Tograflner: An Instrument For Measuring Surface Microtopography", Young et al.
*Review of Sci. Inst.*, vol 43, No. 7, 7-72, pp. 999-1011.

*Primary Examiner*—Bruce C. Anderson
*Attorney, Agent, or Firm*—Jackson E. Stanland

[57] ABSTRACT

An improved electron bombardment induced conductivity apparatus and method is described for charge collection imaging of semiconductor materials and devices with unprecedented resolution. This is accomplished by bombarding a very small area of the surface of a specimen with low-energy electrons rather than high-energy electrons and by physically scanning (i.e. moving) the electron source itself (rather than only the beam of electrons) with respect to the specimen. A very small area of the specimen surface is bombarded with low-energy electrons without any need to do focussing by emitting the low-energy electrons from a sharply pointed electrode positioned very close to the surface being bombarded with the low-energy electrons. Hole-electron pairs created by the electron bombardment are sensed (preferably collected by an electric field) and a measurement of the sensed number of such pairs is displayed in synchronism with the electrode scanning to produce a charge collection image of the specimen.

22 Claims, 3 Drawing Figures

APPARATUS AND METHOD FOR DISPLAYING HOLE-ELECTRON PAIR DISTRIBUTIONS INDUCED BY ELECTRON BOMBARDMENT

DESCRIPTION

1. Technical Field

This invention relates to methods and apparatus for displaying hole-electron pair distributions induced by electron bombardment, the best known example of which is the electron beam induced conductivity (EBIC) method (sometimes generally referred to as charge collection imaging). Methods and apparatus of this type are used for examining structural and other characteristics of nonmetallic specimens, such as semiconductor materials and devices (e.g., integrated circuits or electroluminescent diodes). It particularly relates to a high resolution method and apparatus of this type in which the bombarding electrons have low energy.

2. Background of the Invention

In the conventional EBIC method, a nonmetallic sample, such as a semiconductor device, is biased with an internal electric field and scanned with a focused electron beam in a scanning electron microscope (SEM). The incident electrons create hole-electron pairs or carriers in the sample material, which then become segregated or collected by the internal electric field by flowing in opposite directions to electrical contacts, forming a current in an external circuit. The hole-electron pairs are typically collected by (i.e. the internal electric field is produced by) a p-n junction, a Schottky barrier or collecting electrodes. The electron beam induced current produced in the external circuit is then displayed in synchronism with the electron beam scanning of the surface of the sample to produce an image of the sample under investigation. Since the efficiency with which hole-electron pairs are generated in the specimen as well as the efficiency with which they are collected depend upon local characteristics of the material being irradiated by the electron beam, the display produces an image revealing information about the spatial characteristics or structure of the sample.

The EBIC method can be used, for example, to image dislocations which are often formed in the vicinity of p-n junctions as a consequence of the diffusion of p- or n-type impurities into semiconductor material, which results in local plastic deformation due to lattice distortion caused by the high impurity concentration building up at the surface when the p-n junction is formed. The EBIC method also can be used to image crystal defects, inversion layers, depletion regions, etc. A description of the EBIC method is contained in H. J. Leamy, "Charge Collection Scanning Electron Microscopy," J. Appl. Phys, Vol. 53, No. 6, R51-R80 (1982) and in J. I. Goldstein and H. Yakowitz, *Practical Scanning Electron Microscopy*, Plenum Press (New York and London, 1975) at p. 202 et seq., which are hereby fully incorporated by reference. Although the conventional EBIC method has great value, it suffers from limited resolution due to deep penetration of the incident electrons into the specimen body. During penetration, the electrons scatter in all possible directions, thereby causing the electron beam to spread. Some elastic scattering occurs, but inelastic scattering also occurs, thus creating hole-electron pairs. Since semiconductor elements are getting ever smaller, investigation of material and device characteristics is being desired on an ever finer scale. As a result, a higher resolution method is needed for displaying hole-electron pair distributions induced by electron bombardment.

Although it has been realized in theory that electron scattering effects may be reduced by lowering the energy of the electrons in an electron beam, the minimum achievable beam diameter in conventional electron beam machines increases as the energy of the electrons in the beam is reduced because of chromatic aberration in the magnetic and/or electronic lenses, among other causes. Consequently, as the energy of the electrons in a conventional electron beam is reduced, the resolution actually deteriorates rather than improves as a result of the increasing beam diameter, even though electron scattering itself becomes less of problem.

SUMMARY OF THE INVENTION

An object of the present invention is to provide an improved electron bombardment induced conductivity method and apparatus for charge collection imaging of semiconductor materials and devices with unprecedented resolution.

This is accomplished in accordance with this invention by bombarding a very small area of the surface of a specimen with low-energy electrons rather than high-energy electrons and by physically scanning (i.e. moving) the electron source itself (rather than only the beam of electrons) with respect to the specimen.

As previously pointed out, a high resolution beam of low-energy electrons cannot be formed with conventional electron beam apparatus, since low-energy electrons cannot be focussed to form a suitably small diameter (high resolution) beam of practical electron density. In accordance with this invention, however, a very small area of the specimen surface is bombarded with low-energy electrons without any need to do focussing by emitting the low-energy electrons from a sharply pointed electrode positioned very close to the surface being bombarded with the low-energy electrons.

The electron emitting pointed electrode is physically scanned in very close proximity to the specimen surface. A voltage is applied between the pointed electrode and the specimen surface so as to cause electrons to be emitted from the point and travel to and bombard the specimen surface. High resolution is achieved by keeping both the diameter of the apex of the pointed electrode and the distance between the point and the specimen surface suitably small. The voltage between the surface and the electron emitting point is less than 100 volts (preferably less than 10 volts), so that the energy of the electrons bombarding the surface is low and scattering is reduced or eliminated.

While the pointed electrode is scanned over (and preferably at an essentially constant distance from) the surface of the specimen to be investigated, hole-electron pairs created by the electron bombardment are sensed and a measurement of the sensed number of such hole-electron pairs is displayed in synchronism with the electrode scanning to display the distribution of hole-electron pairs induced by the electron bombardment, thereby revealing structural or other characteristics thereof. The distance between the pointed electrode and specimen surface, as well as the diameter of the electrode tip, is preferably between 0.1 and 10 nanometers and the voltage between the pointed electrode and the specimen surface is preferably between 1 and 10 volts.

When the separation between the pointed electrode and the surface being bombarded is less than about 1 nm (nanometer), the electron clouds of the atoms at the apex of the pointed electrode and at the surface opposite the apex touch, and a tunnel current path is established between the apex of the pointed electrode and the surface. When the separation is more than about 3 nm, electrons must leave the pointed source via field emission. When the separation is between about 1 and 3 nm, both current effects are experienced. In any case, the area of the surface receiving the electrons has a diameter roughly equal to the distance between the point source of the electrons and the target surface.

Low-energy electrons have been emitted from a point electron source positioned close to a surface in the Scanning Tunneling Microscope, described by G. Binnig et al., for example, in the article entitled, "Surface Studies by Scanning Tunneling Microscopy", 49 Phys. Rev. Lett. 57-61 (1982), and in the Binnig et al. article entitled, "Tunneling Through a Controllable Vacuum Gap," 40 Appl. Phys. Lett. 178-180 (1982), and in the Binnig et al. U.S. Pat. No. 4,343,993. Low-energy electrons have also been emitted from a point electron source positioned close to a surface by the apparatus described by R. D. Young in "Field Emission Ultramicrometer", 37 Rev. Sci. Instrum. 275-278 (1966).

While it may be observed in retrospect that these prior art devices did bombard a small surface area with low-energy electrons, these devices were not used to display a hole-electron pair distribution induced by electron bombardment or to form a charge collection image but rather were used to measure distance or height and to form a topological image. The prior art devices were not used to create hole-electron pairs and no known prior suggestion has been made to so use the prior art devices. Furthermore, the prior art devices did not sense hole-electron pairs (either knowingly or inherently) and did not have the capability to do so. In the present invention, the surface of a specimen is being scanned with low-energy electrons for the purpose of creating hole-electron pairs in the irradiated specimen. In the prior art devices, the effect that the proximate surface had upon the emission characteristics of the electron source was used to control or measure the position of the electron source with respect to the surface, for the purpose of measuring the position or height of the proximate surface and for displaying the surface topology, not for creating a distribution of hole-electron pairs in the specimen and for displaying this distribution. No known prior art appears to use a point electron source positioned very close to the surface of a specimen for the direct purpose of creating hole-electron pairs in a very small region of the specimen material rather than for some other purpose.

DESCRIPTION OF THE PREFERRED EMBODIMENTS

Figure 1:
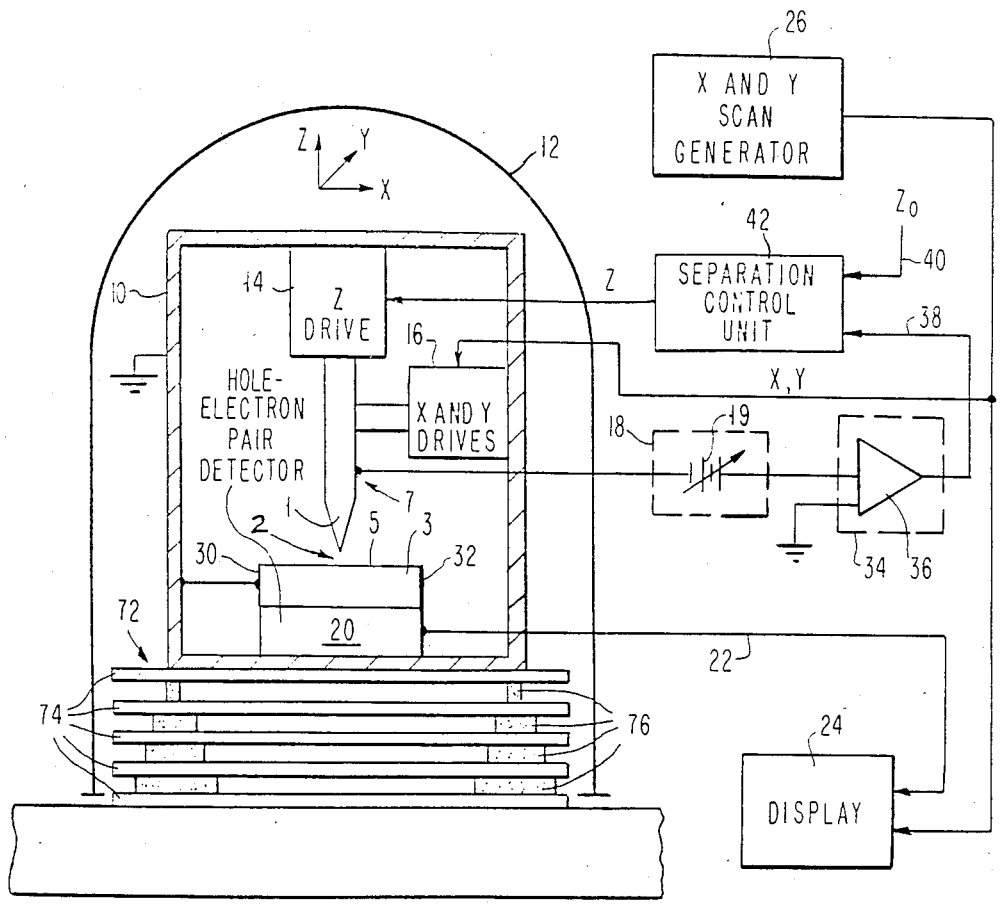
FIG. 1 schematically illustrates apparatus for displaying hole-electron pair distributions induced by low-energy electron bombardment in accordance with this invention.

Referring now to FIG. 1, a specimen 3 to be investigated, such as a semiconductor device or the like, is positioned (preferably inside a vacuum vessel 12) with a top surface 5 thereof opposite and in very close proximity to an electron emitting electrode 7. The electron source 7 has a very sharply pointed end or tip 1 separated from but closely adjacent to surface 5. The radius at the apex of tip 1 of electrode 7 preferably is on the order of 10 nanometers (nm) or less.

In carrying out the method of this invention, the electron emitting pointed source 1 is physically scanned (moved) with respect to specimen 3 along one or two dimensions at an essentially constant distance from surface 5, which is on the order of 1 to 10 nm. In order to do this, the relative separation (gap 2) between tip 1 and surface 5 preferably should be dynamically controlled during the scanning process. Separate coarse and fine mechanical positionment apparatus can be used for adjusting the relative position of the tip and surface both in the separation (Z) direction and in the scan direction(s) X and Y. Either the tip or the surface or both may be moved. Preferably, the mechanical positioning mechanism(s) should be able to scan the tip 1 across the surface 5 with a resolution on the order of 1 nanometer and should be able to control the separation between the tip and surface to an accuracy on the order of 0.1 nm. Mechanical drive mechanisms suitable for accomplishing this are well known and do not form any part of this invention. Suitable positioners have been described, for example, in IBM Technical Disclosure Bulletin, Vol. 26, No. 10A, March 1984, at pages 4898-99, and in the Binnig et al. Scanning Tunneling Microscope references cited earlier, all of which are hereby totally incorporated by reference.

In FIG. 1, the pointed electrode 7 is carried by and positioned in the X, Y and Z directions by positioning mechanisms 14, 16 mounted on a frame 10. A potential difference is maintained between the electrode tip 1 and the surface 5 by a source 18, so as to cause low-energy electrons to flow from electrode tip 1 to surface 5. In FIG. 1, source 18 comprises a voltage source 19, which maintains a substantially constant (though adjustable) voltage potential upon electrode 7, while the specimen is grounded. The resulting electron flow between tip 1 and surface 5 causes hole-electron pairs to be formed in the specimen 3. A measure of the number of the hole-electron pairs formed thereby is sensed (directly or indirectly) by a hole-electron pair detection means schematically represented in FIG. 1 by block 20. A signal 22 from the hole-electron pair detector 20, representing the number or amplitude of generated hole-electron pairs, is then recorded on a suitable device 24, such as a CRT display or a graphical recorder, as a function of the relative X-Y position of the electrode 7 with respect to specimen 3. A scan generator 26 simultaneously drives the X-Y position determining mechanism 16 and the recording device 24 in synchronism.

Relatively high electric field intensities are generated in the immediate vicinity of the tip 1. It is possible that certain specimens might be adversely affected by exposure to such an intense electric field. If protection of the specimen against such a high electric field intensity is needed or desired, it is possible to protect the top surface of the specimen with a thin metallic layer. Incident electrons will pass through a thin metallic layer and generate hole-electron pairs in the underlying specimen, while the thin metallic layer protects the underlying specimen from the intense electric fields in the vicinity of the tip 1.

Any known way of detecting the hole-electron pairs may be used. In theory this may be done even without applying an internal electric field to the specimen to separate hole-electron pairs, say by sensing the light produced when hole-electron pairs recombine. Another way to sense hole-electron pairs without using an electric field to collect the carriers is by sensing eddy currents, such as is described, for example, by E. Brandis and W. Westdorp in an article entitled "Conductivity Variations Measured with an Eddy-Current Technique in an SEM," SCANNING ELECTRON MICROSCOPY/1976 (Part IV), Proc. of the Workshop on Microelectronics Dev. Fabr. & Qual. Control with the SEM, pages 539–542, IIT Research Inst., Chicago, Ill. (April 1976). Still another way of sensing hole-electron pairs without applying an electric field to collect carriers is by using a light spot and microwave absorption, as described in an article entitled "A Nondestructive Method for Measuring the Spatial Distribution of Minority Carrier Lifetime in Silicon Water" Jap. J. Appl. Phys. Vol. 18, pages 2171–2172 (1979).

Figure 2:
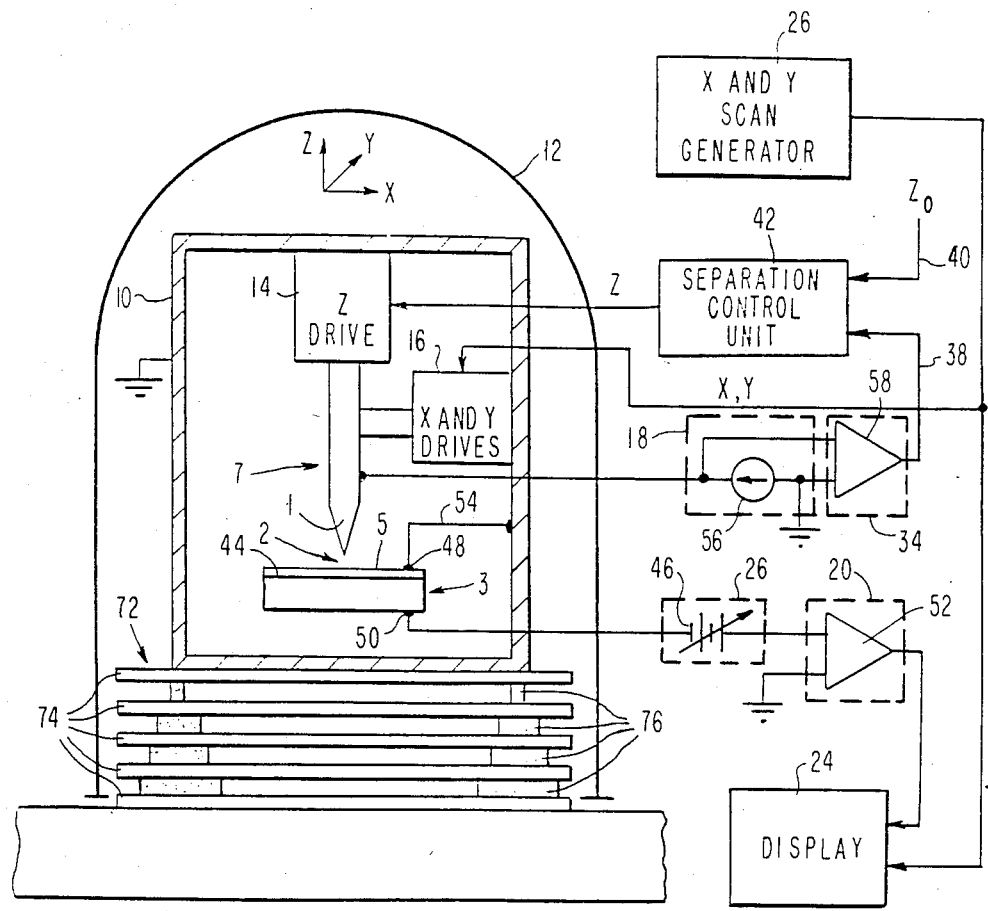
FIG. 2 schematically illustrates an alternative embodiment of this invention.
Figure 3:
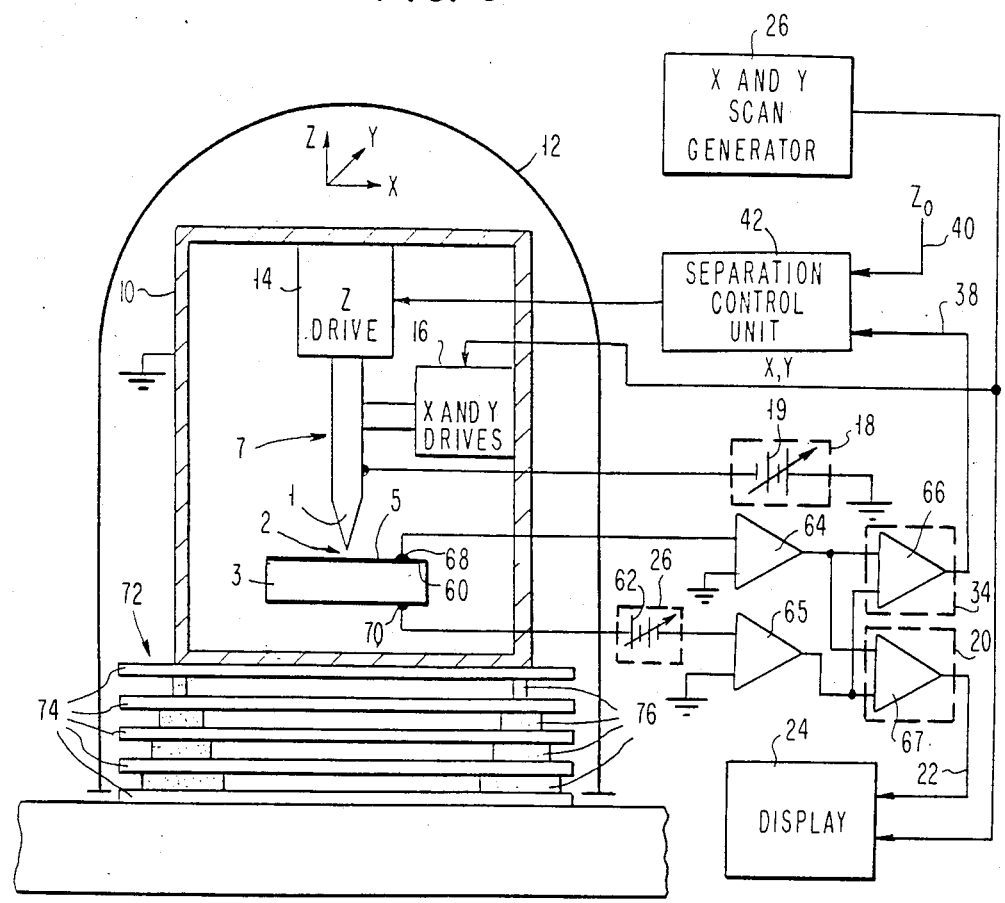
FIG. 3 schematically illustrates still another embodiment of this invention.

It is preferred, however, that detection of the hole-electron pairs be facilitated by applying an electric field across some part or all of the specimen with a field producing source 28 (shown only in FIGS. 2 and 3), so that electrons and holes will flow in opposite directions towards ohmic charge collection contacts to form a current in an external circuit, which may be easily measured. FIGS. 2 and 3 illustrate embodiments in detail where this approach is taken.

With a potential applied between electrode 7 and specimen 3, a field emission current, or tunneling current, or both, depending upon the separation, will flow across the gap 2 between tip 1 and the specimen surface 5. Furthermore, the current gets larger as the separation gets smaller (at a constant voltage across the gap) and may be used to servo control the separation so that it remains substantially constant, which is advantageous. The current incident upon the specimen (which should not be confused with the current resulting from the generation of hole-electron pairs) may be measured in the external circuit which supplies this current to the electrode 7 or may be detected in the external circuit connected to the specimen itself. The former is shown by way of example in FIGS. 1–2, while the latter is illustrated in FIG. 3.

In FIG. 1, the current supplied to electrode 7 is measured by suitable apparatus 34, such as a current amplifier 36. A signal on line 38 representing the amplitude of the current being supplied by the electrode 7 to the surface 5 is compared with a reference amplitude signal on line 40, corresponding with the desired separation $Z_o$, by a servo control unit 42. Servo unit 42 controls the Z direction drive 14 so as to reduce the difference between the signals on lines 38–40, thereby holding the separation between the electrode 7 and surface 5 substantially constant.

In FIG. 2, specimen 3 is a semiconductor device having a horizontally oriented p-n junction 44, biased by voltage source 46 via electrodes 48,50. The p-n junction alternatively could be a transversely oriented junction. Source 46 produces an electrical field in the vicinity of the p-n junction (mostly in the depletion zone). Hole-electron pair detection is done by current amplifier 52. It should be noted in this embodiment that the incident current flow from electrode 7 flows to contact 48 and along line 54 to the grounded frame 10, rather than through contact 50 to amplifier 52. As a result, the incident current from electrode 7 and the current formed by the generated hole-electron pairs are automatically separated and no special circuitry for separating these two current signals is needed. The reverse will be true in FIG. 3.

In FIG. 1, electrode 7 was held at a substantially constant voltage potential by a voltage source 19, and the amplitude of the current supplied thereby to the electrode 7 was measured by a differential current amplifier 36. In FIG. 2, electrode 7 receives a substantially constant current from current source 56, while the amplitude of the voltage required to provide such current is being measured by a differential voltage amplifier 58. Since the voltage at surface 5 is being held at ground potential via line 54, amplifier 58 measures the voltage across gap 2, which increases as the size of gap 2 increases (at a constant current across the gap). The signal on line 38 thus again represents a measure of the separation (gap 2) and is compared by servo unit 42 with a reference on line 40 to automatically control the gap 2 so as to maintain it substantially constant. The number of hole-electron pairs sensed by amplifier 52 again is recorded by a device 24, such as a CRT display or graphical recorder in synchronism with the scan.

In FIG. 3, specimen 3 is shown with a horizontally oriented Schottky barrier 60 at the top surface 5. An electric field is produced at the Schottky barrier (mostly in the depletion region) by a voltage source 62. In the FIG. 3 embodiment, electrode 7 is held at a substantially constant voltage potential by voltage source 19, much as in the FIG. 1 embodiment. However, the incident current flowing across gap 2 is measured at the specimen rather than at the electrode 7. Since the incident current is used to control the size of the gap, while the hole-electron pair generated current is used to form an image with a display or recording device, the incident current and the hole-electron pair generated current must be separated from each other in this embodiment. This is done by two current amplifiers 64, 65 and two differential voltage amplifiers 66, 67. Current amplifier 64 measures the current collected from contact 68, while current amplifier 65 measures the current collected from contact 70. Differential amplifier 66 then adds the two measured currents to determine what current was incident upon surface 5, while differential amplifier 67 subtracts one measured current from the other to determine what current is flowing between the two contacts. The resulting signals are used much as they were in the FIG. 1 and FIG. 2 embodiments.

In view of the fact that electrode 7 is scanned over the surface 5 of specimen 3 at a separation preferably in the nanometer range, and that the resolution attainable with a piezoelectric X-Y translation mechanism, such as is described in the incorporated references, also is on the same order of magnitude, it is important that the electrode 7 and the specimen 3 be isolated from external sound and vibration. This may be achieved, for example, by mounting everything inside vacuum chamber 12 on a damped suspension apparatus 72. The damped suspension apparatus may simply consist of a stack of plates 74 separated by elastic members 76. In order to provide for absorption of vibrations of different frequencies, the cross-sections and/or elasticities of the elastic members 76 may vary along the stack.

While specific embodiments of this invention have been shown and described, it should be apparent to those of ordinary skill that certain changes and modifications can be made without departing from the spirit and scope of this invention as defined in the following claims.

Having thus described my invention, what I claim as new and desire to secure by Letters Patent is:

1. Apparatus for displaying the spatial distribution of hole-electron pairs formed in a specimen by low-energy electron bombardment, comprising in combination:
   a pointed electrode;
   means for spacing a specimen close to said electrode;
   means for providing flow of low-energy electrons from said electrode to said closely spaced specimen to form hole-electron pairs in said specimen;
   means for mechanically scanning said pointed electrode with respect to said closely spaced specimen;
   means for detecting hole-electron pairs formed in said closely spaced specimen by said flow of electrons and for generating a signal representing the number of said formed hole-electron pairs as a function of time; and
   means for displaying said signal in synchronism with said mechanical scanning to form a representation of the distribution of hole-electron pairs formed in said specimen.

2. Apparatus as defined in claim 1 wherein said pointed electrode has a tip diameter on the order of 0.1 to 10 nanometers.

3. Apparatus as defined in claim 1 wherein said means for providing flow of low-energy electrons comprises means applying a voltage between said electrode and said specimen.

4. Apparatus as defined in claim 3 wherein said voltage is less than 100 volts.

5. Apparatus as defined in claim 4 wherein said voltage is between 1 and 10 volts.

6. Apparatus as defined in claim 1 wherein said means for providing flow of low-energy electrons comprises means providing flow of electrons having energy less than 100 electron volts.

7. Apparatus as defined in claim 6 wherein said electrons have an energy of between 1 and 10 electron volts.

8. Apparatus as defined in claim 1 wherein said means for mechanically scanning comprises means for mechanically scanning said electrode across a surface of said specimen at an essentially constant separation distance.

9. Apparatus as defined in claim 8 wherein said means for scanning at an essentially constant distance comprises a servo control system.

10. Apparatus as defined in claim 9 wherein said servo control system comprises means for sensing the current flow between said electrode and said specimen and means for controlling the separation between said electrode and specimen so as to maintain said sensed current flow substantially constant.

11. Apparatus as defined in claim 9 wherein said servo control system comprises means for sensing the voltage between said electrode and said specimen and means for controlling the separation between said electrode and specimen so as to maintain said sensed voltage substantially constant.

12. Apparatus as defined in claim 1 wherein said means for detecting hole-electron pairs comprises means applying an electric field across at least a region of said specimen so as to cause electrons and holes to flow in opposite directions.

13. Apparatus as defined in claim 12 wherein said means applying an electric field comprises two electrical contacts on said specimen and voltage source means applied across said two contacts.

14. Apparatus as defined in claim 13 wherein said signal representing the number of formed hole-electron pairs is the current flow between said contacts.

15. Apparatus as defined in claim 1 wherein said means for displaying said signal comprises cathode ray tube scanned in synchronism with said means for mechanical scanning, the beam intensity of said tube being controlled by said signal representing the number of formed hole-electron pairs.

16. Apparatus as defined in claim 1 wherein said means for displaying said signal comprises a graphical plotter.

17. Apparatus as defined in claim 1 wherein said mechanical scanning means provides two dimensional scanning and said display means generates a two dimensional charge collection image of said specimen.

18. Apparatus as defined in claim 1 wherein said means for detecting hole-electron pairs comprises a p-n junction within said specimen and said displayed representation of the distribution of hole-electron pairs is a charge collection image of said p-n junction.

19. Apparatus as defined in claim 1 wherein said means for detecting hole-electron pairs comprises a Schottky barrier within said specimen and said displayed representation of the distribution of hole-electron pairs is a charge collection image of said Schottky barrier.

20. Apparatus as defined in claim 1 wherein said specimen comprises semiconductor material.

21. A method for displaying the spatial distribution of hole-electron pairs formed in a specimen by low-energy electron bombardment, comprising the steps of:
   positioning a pointed electrode close to but spaced from a specimen;
   applying a voltage between said electrode and said specimen to provide flow of low-energy electrons from said electrode to said specimen in order to form hole-electron pairs in said specimen;
   mechanically scanning said pointed electrode with respect to said closely spaced specimen;
   sensing the number of hole-electron pairs formed in said closely spaced specimen by said flow of electrons as a function of time; and
   displaying said sensed number of formed hole-electron pairs in synchronism with said mechanical scanning.

22. The method defined in claim 21 wherein said sensing is done by collecting charge carriers with an electric field and said displaying produces a charge collection image of said specimen.

* * * * *